US006633716B2

(12) United States Patent
Csutak

(10) Patent No.: US 6,633,716 B2
(45) Date of Patent: Oct. 14, 2003

(54) OPTICAL DEVICE AND METHOD THEREFOR

(75) Inventor: Sebastian M. Csutak, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 155 days.

(21) Appl. No.: 09/846,086

(22) Filed: May 2, 2001

(65) Prior Publication Data
US 2002/0164142 A1 Nov. 7, 2002

(51) Int. Cl.$^7$ ................................................. G02B 6/10
(52) U.S. Cl. ....................................................... 385/131
(58) Field of Search .............................. 385/14, 37, 1, 385/2, 3, 129, 130, 131

(56) References Cited

U.S. PATENT DOCUMENTS

| | | | |
|---|---|---|---|
| 3,982,810 A | | 9/1976 | Tamir et al. ............... 350/96 |
| 4,006,432 A | | 2/1977 | Streifer et al. ........... 331/94.5 |
| 5,033,812 A | | 7/1991 | Yoshida et al. ......... 350/96.19 |
| 5,101,459 A | | 3/1992 | Sunagawa .................. 385/37 |
| 5,315,676 A | | 5/1994 | Sunagawa .................. 385/37 |
| 5,657,407 A | | 8/1997 | Li et al. ..................... 385/37 |
| 5,699,378 A | * | 12/1997 | Lealman et al. ........... 372/102 |
| 5,982,334 A | * | 11/1999 | Manasson et al. .......... 343/785 |
| 6,198,855 B1 | * | 3/2001 | Hallemeier et al. ........... 385/2 |
| 6,298,177 B1 | * | 10/2001 | House ......................... 385/3 |
| 6,420,707 B1 | * | 7/2002 | Anthony et al. .......... 250/338.4 |
| 6,433,399 B1 | * | 8/2002 | Polman et al. .............. 257/432 |
| 6,480,642 B1 | * | 11/2002 | Kawashima et al. ......... 385/14 |

FOREIGN PATENT DOCUMENTS

EP       0383627 B1   8/1990   ............ G02B/6/12

OTHER PUBLICATIONS

Ang et al., "Effects of Grating Heights on Highly Efficient Unibond SOI Waveguide Grating Couplers," IEEE, pp. 59–61 (2000). No month.

Ang et al., "Highly efficient unibond silicon–on–insulator blazed grating couplers," American Institute of Physics, Applied Physics Letter, vol. 77 No. 25, Dec. 18, 2000, pp. 4214–4216.

Orobtchouk et al., "High–efficiency light coupling in a submicrometric silicon–on–insulator waveguide," Applied Optics, vol. 39 No. 31, Nov. 1, 2000, pp. 5773–5777.

Ang et al., "Grating couplers using Silicon–On–Insulator," SPIE vol. 3620, Jan. 1999, pp. 79–86.

Chen et al., "High–efficiency and high–speed silicon metal–semiconductor–metal photodetectors operating in the infrared," American Institute of Physics, Applied Physics Letter 70, Feb. 10, 1997, pp. 753–755.

(List continued on next page.)

Primary Examiner—Lynn Feild
Assistant Examiner—Thanh-Tam Le
(74) Attorney, Agent, or Firm—Kim-Marie Vo; James L. Clingan, Jr.

(57) ABSTRACT

A photodetector uses a semiconductor on insulator (SOI) substrate having an optical grating over the silicon semiconductor to change the direction of incident light to divert it into the silicon which functions as waveguide. The underlying insulator operates as one boundary of the waveguide and the overlying grating operates as the other. Photodetector electrodes are placed in the silicon, which puts them in close proximity to the carriers that are generated by the light entering the silicon waveguide.

23 Claims, 4 Drawing Sheets

OTHER PUBLICATIONS

Liao et al., "High-Efficiency Focusing Waveguide Grating Coupler with Parallelogramic Groove Profiles," IEEE, pp. 1142–1148 (1997). No month.

Liu et al., "140-GHz metal-semiconductor-metal photodetectors on silicon-on-insulator substrate with a scaled active layer," American Institute of Physics, Applied Physics Letter 65, Aug. 15, 1994, pp. 887–888.

Emmons et al., "Buried-Oxide Silicon-on-Insulator Structure II: Waveguide Grating Couplers," IEEE, pp. 164–174 (1992). No month.

Weller-Brophy et al., "Local Normal Mode Analysis of Guided Mode Interactions with Waveguide Gratings," IEEE, pp. 1069–1081 (1988). No month.

* cited by examiner

US 6,633,716 B2

OPTICAL DEVICE AND METHOD THEREFOR

RELATED APPLICATIONS

This application is related to application SC11378TP, entitled "An Opto-Coupling Device Structure and Method Therefor," and assigned to the assignee hereof.

FIELD OF THE INVENTION

The invention relates to optical devices and more particularly to photodetectors made as an integrated circuit.

RELATED ART

A continuing object of integrated circuit manufacturing is to increase the speed of operation. One of the issues relating to using integrated circuits is the interconnect with the integrated circuit itself. The interconnect itself has and creates speed limitations. Some of these relate to the physical interconnect and others relate to distances that must be covered by the signal that is either received or transmitted by the integrated circuit. One of the techniques that is being studied to improve this is the use of light as opposed to an electrical signal for the source of information for the integrated circuit. The typical integrated circuit has a silicon substrate, which does provide the capability, albeit a not very good one, of being a photodetector. One of the reasons silicon is not considered a particularly good photodetector is that its absorption coefficient is low compared to some other materials such as germanium.

The technique for detecting light using silicon or germanium is to detect carriers generated by the incident light. The incident light must be at frequency that is absorbed by the material as opposed to frequency at which the light is passed. In silicon the frequency of the light that is absorbed has a wavelength less than 1.1 microns, whereas frequencies with a wavelength greater than 1.1 microns are passed. One standard frequency below the 1.1 micron wavelength is the standard for local area networks (LAN), which has a wavelength of 850 nanometers. The light that has a frequency that can be absorbed by the silicon, which generates holes and electrons as the light penetrates and is adsorbed by the silicon. These carriers are then collected to perform the detection of the incident light using biased doped regions in the silicon. The bias is sufficient to fully deplete the substrate or well regions. The incident light carries the information that is to be processed by the integrated circuit.

The efficiency of the detector is increased if more of these carriers, which are generated by the light, can be collected. One of the difficulties with silicon is that about 98% of the carriers are generated over about 20 microns of distance, i.e., the light penetrates into the silicon about 20 microns before it is substantially fully adsorbed. It is difficult to collect most of these carriers, the 98%, rapidly. The electric field provided by the biased doped regions attracts the carriers. As the distance between the doped regions and the carriers increases, the electric field diminishes. These carriers that are in the low electric field areas are too slow in reaching the doped regions where they can be detected. The result is a rate of detection which is not a fast enough to provide a significant improvement over that available by using normal electrical signals.

To have the requisite speed of detection, the collectors of the carriers must be in closer proximity to the generation of the carriers. A technique for improving the speed was to isolate many of the carriers that were generated relatively far from the doped regions using conventional SOI type substrates. Thus, the incident light would generate carriers at the surface and continue generating carriers but most of the carriers would be generated below the insulating layer which is part of an SOI substrate. This improves the speed because only the carriers that were generated close to the electrodes reached the doped regions, but most of the carriers were generated below the insulating layer so that the detection itself was difficult. Detection typically includes biasing doped regions to attract the holes or electrons that are the carriers that are generated by the incident light. The fact that these doped regions are biased inherently makes it difficult to detect very small amounts of charge. Thus, the more charge that is available for detection, the more effective the detection will be.

Thus there is seen a need for a photodetector in a semiconductor that can be fast enough and reliable enough to detect signal information from light.

BRIEF DESCRIPTION OF THE DRAWINGS

The present invention is illustrated by way of example and not by limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

A photodetector is made using a semiconductor as an absorber and detector. At the surface of a substrate that has the semiconductor is a grating that is used to redirect the light. Below the silicon is an insulating layer so that the silicon operates as a waveguide. The incident light is redirected in the direction of the silicon. The detector is located in the silicon in the form of doped regions. Because the light is redirected so that it is contained within the silicon area, all the carriers that are generated are in close proximity to the doped regions, which operate as collectors of the carriers. This provides for an efficient photodetector that is both fast and provides for relative easy detection.

Figure 1:
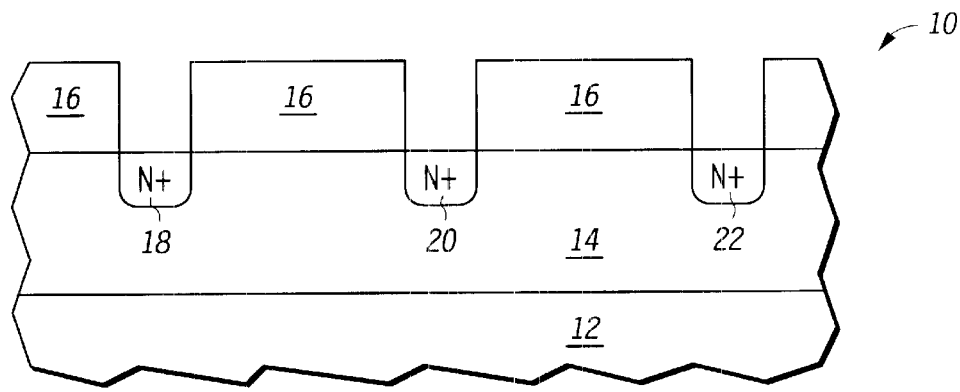
FIG. 1 is a cross section of a portion of an integrated circuit at a stage in processing according to an embodiment of the invention.

Shown in FIG. 1 is a portion of an integrated circuit 10 comprising a insulating region 12, a semiconductor region 14, a patterned photoresist 16, an N-doped region 18, an N-doped region 20, and an N-doped region 22. Pattern photoresist 16 results from patterning a photoresist layer which was deposited over semiconductor region 14. Typically an oxide layer, not shown, would be between the photoresist and the silicon. After patterning this photoresist layer, photoresist 16 is provided. An N+ implant then occurs to form N+ regions 18, 20 and 22. Insulating region 12 and semiconductor region 14 comprise a silicon on insulator (SOI) substrate, which is readily available in the industry.

Figure 2:
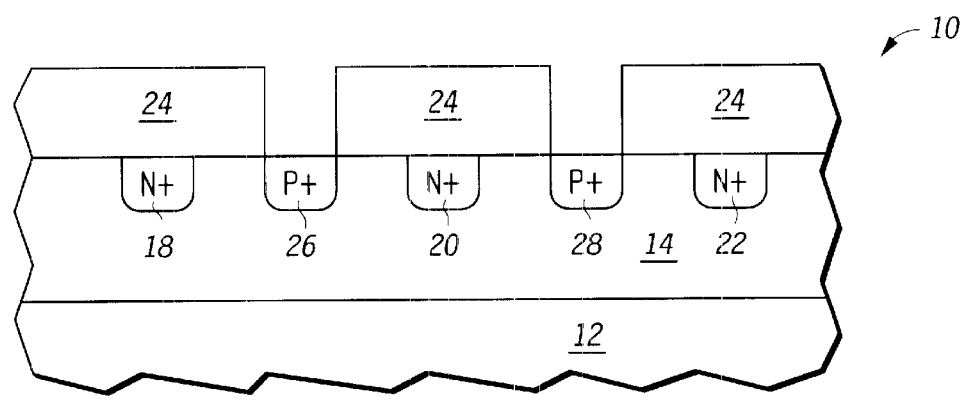
FIG. 2 is a cross section of the integrated circuit of FIG. 1 at a subsequent stage in processing.

Shown in FIG. 2 is integrated circuit 10 after pattern photoresist 16 has been deposited and another photoresist layer has been deposited and patterned to result in patterned photoresist layer 24. Pattern photoresist layer 14 provides as a mask for a P-type implant, which results in P-doped regions 26 and 28. P-doped regions 26 and 28 are interleaved between N-doped regions 18, 20 and 22.

Figure 3:
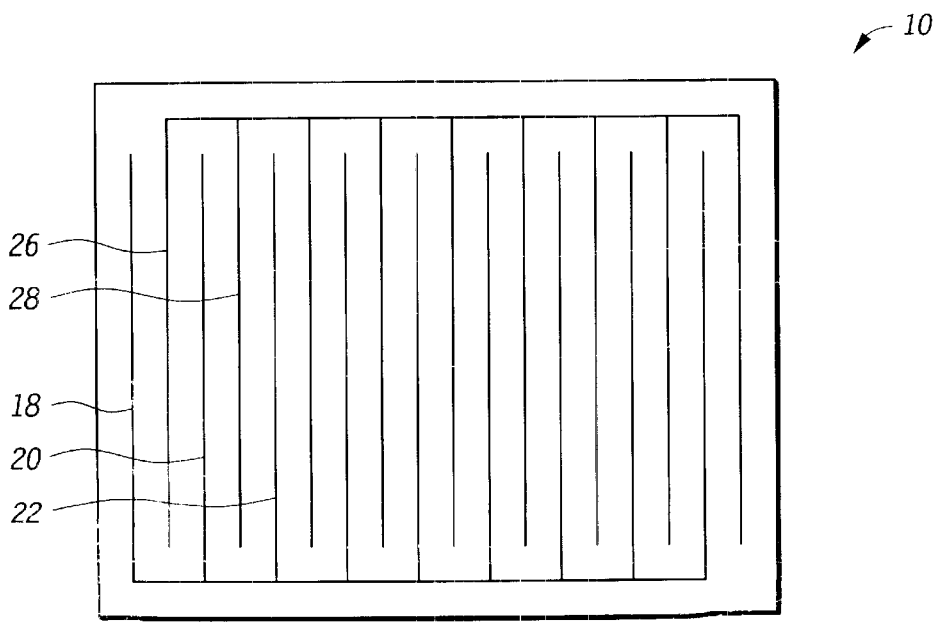
FIG. 3 is a top view of the integrated circuit of FIG. 2.

Shown in FIG. 3 is a top view of an additional portion of integrated circuit 10 showing the interleaving of N and P doped regions. This shows N-doped regions having a common connection at the bottom and P-doped regions having a common connection at the top. This portion of integrated circuit 10 shows the target area of incident light.

Figure 4:
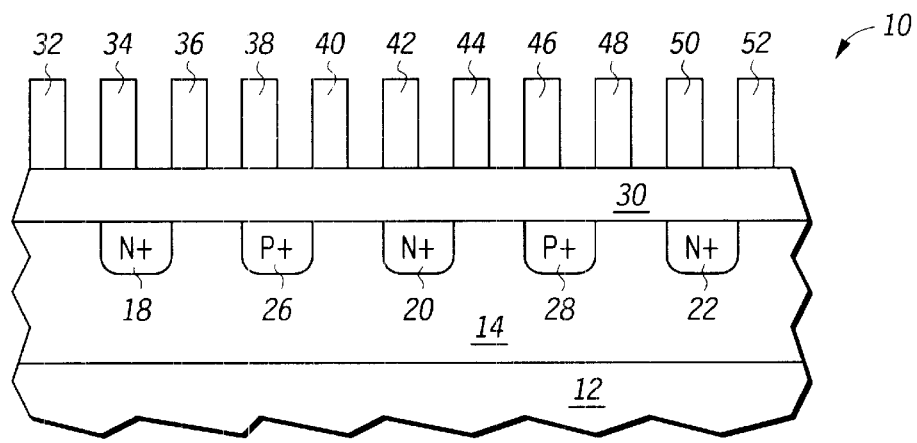
FIG. 4 is a cross section of integrated circuit of FIG. 2 at a subsequent stage in processing.
Figure 5:
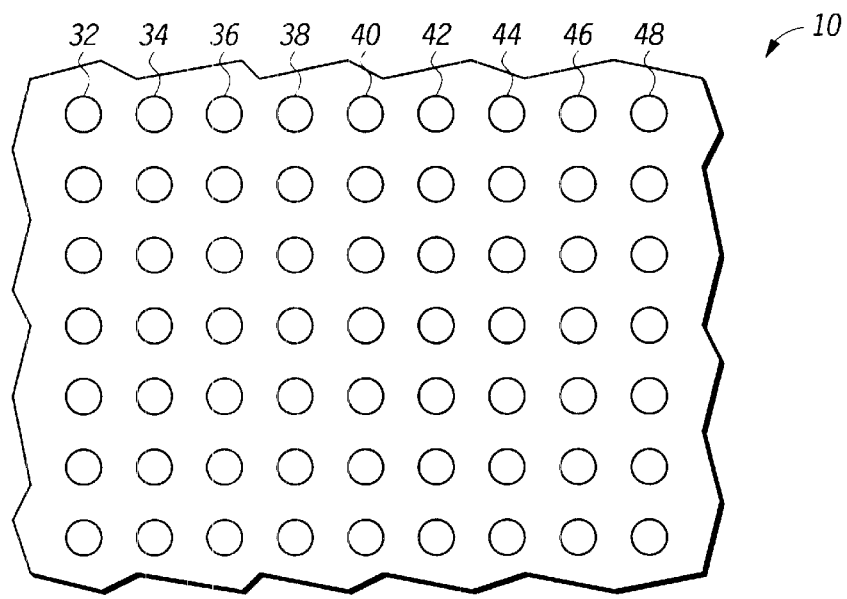
FIG. 5 is a top view of the integrated circuit of FIG. 4.

Shown in FIG. 4 is after additional processing of integrated circuit 10. A nitride layer 30 is deposited over semiconductor region 14. A photoresist layer is then deposited over nitride layer 30 and patterned to form a pattern photoresist layer comprising photoresist pillars 32, 34, 36, 38, 40, 42, 44, 46, 48, 50 and 52. These pillars 32–52 are substantially cylindrical in shape, which is reasonably easy to achieve. Shown in FIG. 5 is a portion of integrated circuit 10, as a top view at the stage in processing shown in FIG. 4., which shows the pillars in a matrix fashion.

Figure 6:
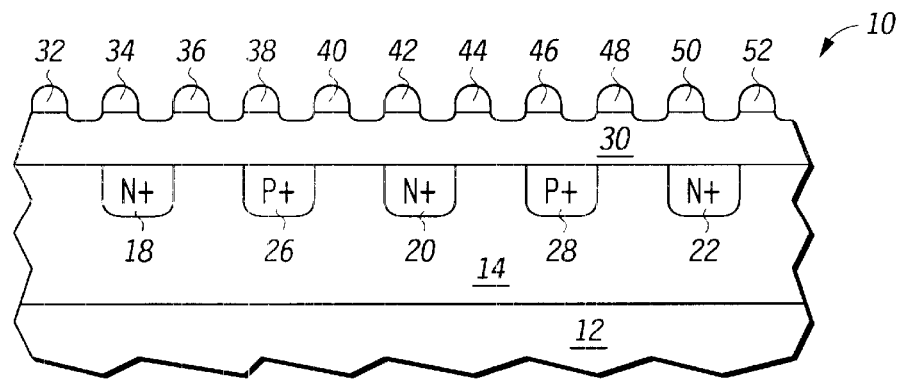
FIG. 6 is a cross section of the integrated circuit of FIG. 4 at a subsequent stage in processing.
Figure 7:
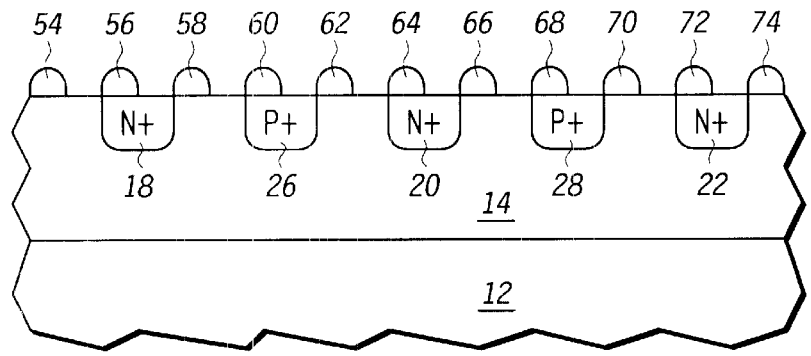
FIG. 7 is a cross section of a integrated circuit of FIG. 6 at a subsequent stage in processing.

Shown in FIG. 6 is integrated circuit 10 at a stage in processing after a partial etch of photoresist pillars 32–48 and nitride layer 30. This shows that pillars 32–52 are not only being reduced in height but also being reduced in diameter. The etch of the nitride is directional but the photoresist is nonetheless etched laterally as well so that the photoresist pillars, whose sidewalls are exposed, are reduced in diameter to expose more and more of the nitride. But the nitride that has received the maximum exposure is that area which is between the original pillars. As the pillars decline in diameter additional nitride is exposed. Thus, there is a slope formed in the nitride toward the photoresist. The etch of the nitride between photoresist pillars continues and the result is shown in FIG. 7. This shows hemispherical shaped nitride features 54, 56, 58, 60, 62, 64, 66, 68, 70, 72 and 74. These nitride features are positioned to have a periodicity chosen for the frequency that is desired to be passed between semiconductor region 14 and an area above nitride features 54–74. Nitride features 54–74 comprise an optocoupling grating.

Semiconductor region 14 operates as a waveguide with nitride features 54–74 operating as the opto-coupling diffraction grating. The silicon of semiconductor region 14 has a higher index of refraction than the silicon oxide of insulating layer 12. Another insulating layer may also be used which has a lower index of refraction than that of the semiconductor layer above it. The nitride features also have a lower index of refraction than the semiconductor layer 14.

There is a dimension of periodicity of the nitride features that will result in light traveling laterally in patterned semiconductor region 14 which will also pass through the diffraction grating of nitride features 54–74. The typical angle of incident of light with respect to the opt-coupling grating is 80 degrees plus or minus 5. Thus, it is near vertical but not quite. The periodicity of nitride features 54–74 is selected based upon the frequency of the incident light at nominally 80 degrees. A typical and standard frequency for local area networks (LAN) is light with a wavelength of about 850 nanometers (nm) for the nominal angle of 80 degrees for the light entering the opto-coupling diffraction grating. The period using nitride for the grating is about 290 nanometers (nm). At this wavelength of 850 nm light is absorbed by silicon so the intended use is as a photodetector with the benefit of very good efficiency. The doped regions 18–22 and 26–28 are used to collect the photo-generated carriers.

This diffraction grating can also be used at for a wavelength of 1310 nm, which is the standard for metropolitan area network, but would be used as a transmitter with silicon as the waveguide as is the case shown in FIG. 7 for which semiconductor region 14 is described as being silicon. Semiconductor region 14 may, however, be a different composition that would make it sensitive to 1310 nm radiation. One way to do this is to alloy the silicon with germanium.

An advantage of the hemispherical shape is that the efficiency of coupling is not significantly affected by the polarization of the incident light. Thus, non-polarized light will pass very well through the opto-coupling grating in which the individual features are hemispherical. If instead of using a matrix of small features, a number of fingers that are in parallel with each other are used, the bending is effective based upon the periodicity of the fingers but the coupling is only good for the light that is polarized in the direction of the fingers. The light which has polarization aligned perpendicular to the features is substantially blocked.

Figure 10:
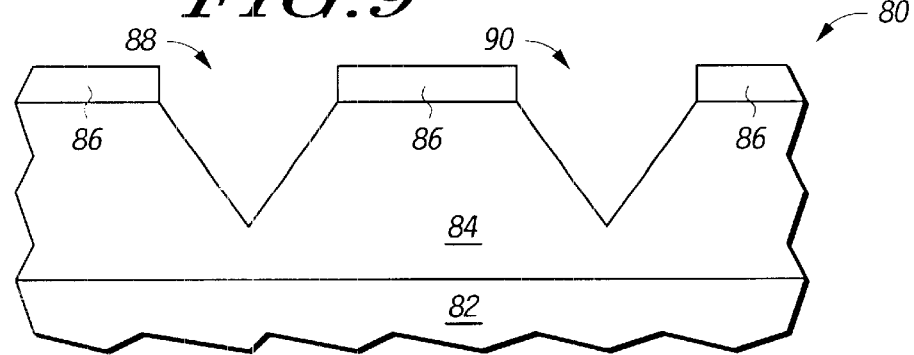
FIG. 10 is a cross section of an integrated circuit of FIG. 9 at subsequent stage in processing.
Figure 11:
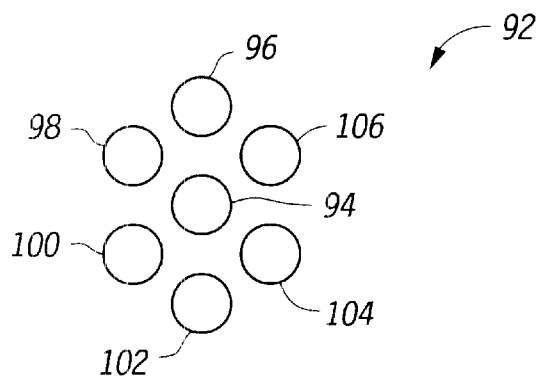
FIG. 11 is a top view of an arrangement of grating features according to an embodiment of the invention.

An alternative to the square matrix shown for example, in FIG. 5, is to have each photoresist pillar be of equal distance from the others. This would be six pillars equidistant from any other pillar, as shown in FIG. 10. This could be called a hexagonal pattern because it would be six pillars equidistant from any other pillar. This may be the most effective for passing non-polarized light and is mostly usefully implemented if the diffraction features, such as pillars nitride pillars 54–74, are round. Shown in FIG. 11 is hexagonal pattern 92 comprised of round diffraction features 96, 98, 100, 102, 104, and 106, which surround diffraction feature 94 with a radius that is equal to the desired period for the grating to achieve the desired bending for the particular frequency.

The purpose of N-doped regions and P-doped regions such as 18–22 and 26–28 is to collect electrons for the case of N-doped regions and collect holes for the P+ regions. Semiconductor region 14 is doped very lightly to P–, a typical starting material for an integrated circuit but even lower doping levels may be even more advantageous. The use of an etchant, which directionally attacks the nitride 30 while simultaneously etching the sidewall of the photoresist pillar is used to advantage to obtain the round shape. This is a desirable shape which provides for a matrix such as shown in FIG. 5 or for the hexagonal approach of FIG. 10, which provides equal distance for all of the ultimate nitride features which make up the grating which then can maximize the coupling. The hexagonal pattern provides for the optimal symmetry, which provide the desired periodicity. The distance between two neighboring features plus the diameter of one of the features is the measure of the period.

Figure 8:
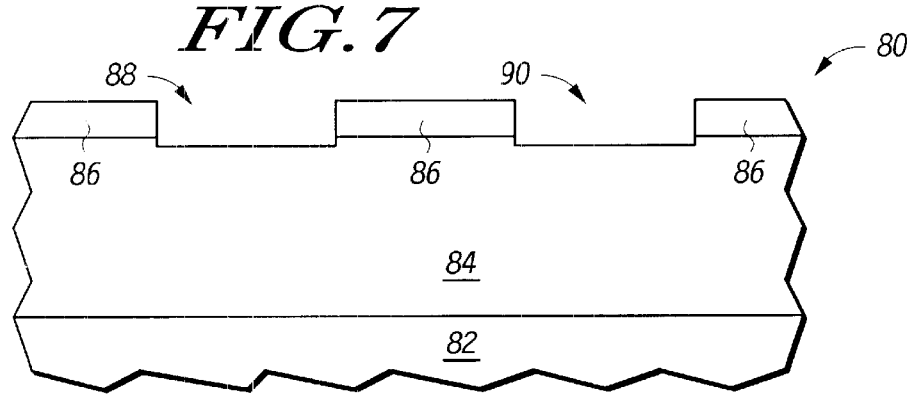
FIG. 8 is a cross section of an integrated circuit at a stage in processing according to an alternative embodiment.

As an alternative to the hemispherical grating features, such as nitride features 54–74 which protrude above the semiconductor region 14, the grating features may also be cavities in the semiconductor region. Shown in FIG. 8 is a portion of an integrated circuit 80 having a semiconductor region 84, which in the present embodiment is silicon, and insulating region 82, a patterned nitride layer 86 with openings 88 and 90 in the nitride. Also, this is achieved by applying photoresist, patterning the photoresist, and then etching the nitride according to the pattern in the photoresist. This leaves openings 88 and 90. Openings 88 and 90 are then roughed by an ion bombardment. This lowers the level of silicon in openings 88 and 90 slightly as well as roughening the surface of the silicon at openings 88 and 90. After the ion bombardment of openings 88 and 90, an etch comprised of potassium hydroxide (KOH) in liquid form is performed. With the crystal structure of silicon, a wet KOH etch is anisotropic. This etch is along the 111 plane of the silicon, substrate 84. The result is a pyramid shape removed from the silicon in openings 88 and 90.

Figure 9:
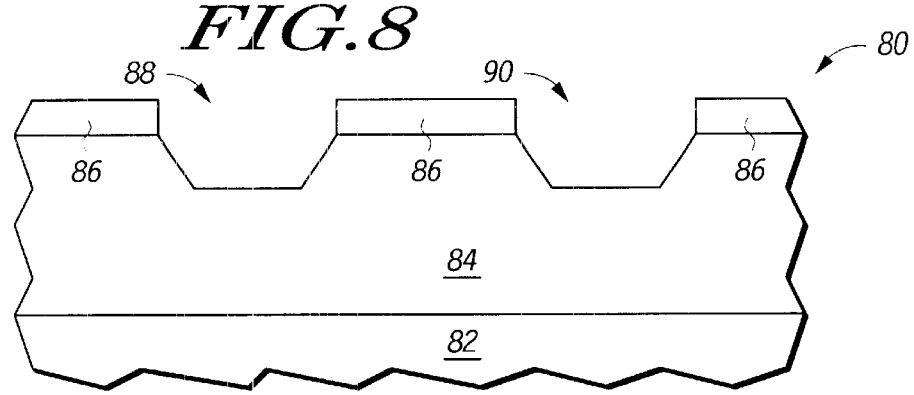
FIG. 9 is a cross section of an integrated circuit of FIG. 8 at a subsequent stage in processing.

Shown in FIG. 9 is a stage in the processing using the wet KOH etch to etch at the angle shown and is along the 111 plane of silicon region 84. The etch continues with the result shown in FIG. 10, which is a pyramid-shaped cavity in semiconductor region 82. This is an advantageous process because it is highly repeatable. The etching will essentially stop once the pyramid is formed. The etch rate is extremely slow into the 111 plane but rapid along it. Thus, what is left is the silicon aligned in the 111 direction. These pyramids thus can replace the nitride features that protrude above the silicon surface and instead be cavities within the silicon region. The pyramid-shaped features, which are surrounded by air, form a layer with a lower average index of refraction than silicon. Thus the silicon, substrate 84, is effective as a waveguide because it has a lower index of refraction both above and below it.

The period of these pyramid shapes can be achieved as desired. The period in this case is the distance between openings 88 and 90 plus the length of one of these openings shown in FIG. 9. These pyramids shapes can be aligned in the matrix shown in FIG. 5 for the photoresist pillars. If integrated circuit 10 is used as a photodetector, the doped regions would be conveniently placed to optimize the collection of carriers generated by the incident light.

Figure 12:
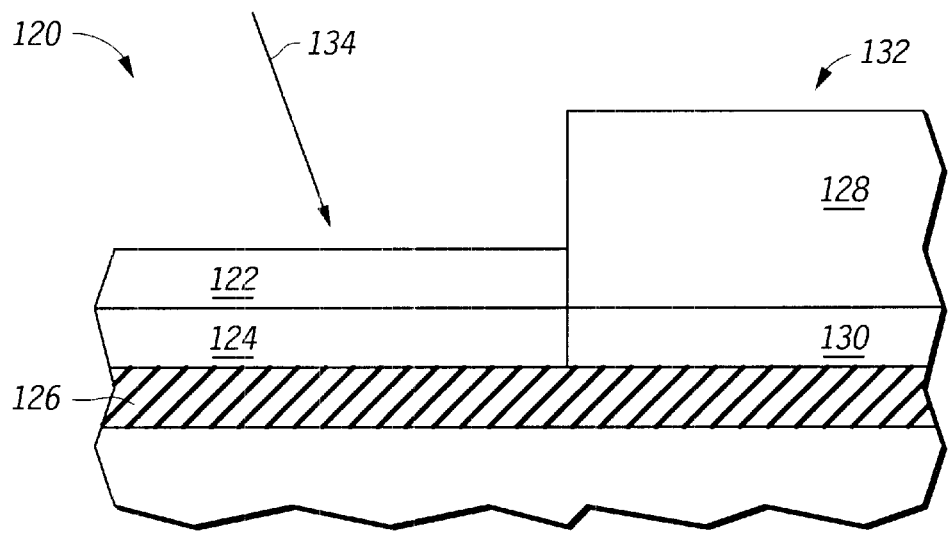
FIG. 12 is a cross section of the semiconductor substrate having a photodetector and processing circuitry according to a preferred embodiment of the present invention.

Shown in FIG. 12 is an integrated circuit 120 comprising a grating 122, a detector 124, an insulator 126, gates and interconnect 128, and sources and drains 130. Integrated circuit 120 utilizes a conventional semiconductor-on-insulator (SOI) substrate in which the semiconductor is preferably silicon and insulator 126 is below the silicon. The silicon is the active region of integrated circuit 120 and is where detector 124 and drains and sources 130 are located. The silicon corresponds to semiconductor region 14 shown in FIG. 2. The regions doped regions 18–22 and 26–28 are relatively highly doped compared to the rest of semiconductor region 14 which is lightly doped to less than or equal to about $10^{14}$ atoms/cm². The A relatively thick layer of silicon underlies insulator 126 primarily to provide physical support. Detector 124 is formed in the silicon above insulator 126. Grating 122 is formed above the silicon substrate surface although, as an alternative, the grating may be formed as part of the silicon itself. Gates and interconnect 128 are formed above the silicon surface which in this case is coincident with top of detector 124. Sources and drains 130 are formed in the silicon surface. The combination of gates and interconnect 128 and sources and drains 130 form a processing circuitry 132, which utilizes information collected by detector 124. In operation, incoming light 134 strikes grating 122 and generates in the silicon carriers that are detected by detector 124. After detection by detector 124, processing circuitry 132 processes this detected signal in a manner according to a chosen design.

Figure 13:
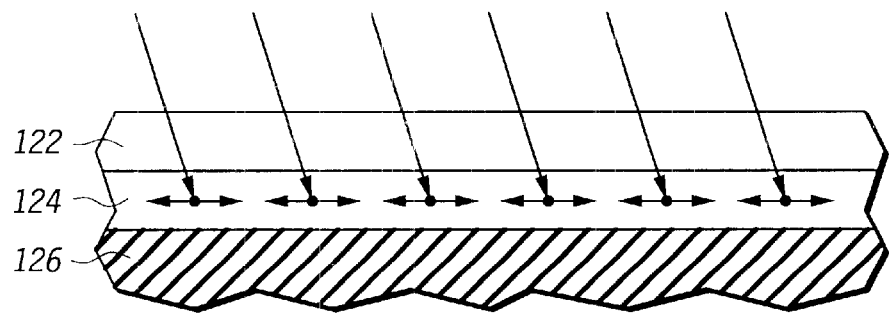
FIG. 13 is a cross section of a portion of the detector shown in FIG. 12.

Shown in FIG. 13 is grating 122, detector 124, and insulator 126 showing the action of incident light on grating 122. This shows that the incident light is striking the grating area, that it enters detector area 124, and that it stays in the area of detector 124. Area between grating 122 and insulator 126 is a waveguide so that the light that enters this waveguide remains there. Thus, detector 124 is in close proximity to the carriers that are created by incident light entering the silicon. Because of grating 122, the incident light is redirected so that it is contained within the waveguide. This results in all the carriers being generated in the waveguide. The detector is also located in the waveguide so that the detector is in close proximity to the areas where the carriers are generated. This results in short distances for the carriers so that are in the relatively strong electric field region of the doped regions that make up the detector. Thus, there is no speed problem in the collection portion of operation.

Also, with all the incident light being contained within range of the detectors, the efficiency is very high. This provides a benefit of ease of detection of the information containing in the incoming light. Grating 122 can be chosen from any of those described in the formation of a grating described for FIGS. 1–11. For example, grating 122 may be the nitride features 54–74 shown in FIG. 7. In the alternative they may be inverted pyramids such as 88 and 90, which are actually formed in the silicon. Detector 124 may be like that shown in FIGS. 2, 3, 4, 6, and 7.

The desired angle of incident light 134 is chosen to optimize the efficiency of transmitting the light into the waveguide created between grating 122 and insulator 126. If 90-degree incident light is utilized then the light entering waveguide would also be 90 degrees in both directions shown in FIG. 13 and actually radially in all directions. This may be preferable. It may also be preferable to have the light come in on one portion of the grating at an angle so that it only goes into the waveguide in one direction or at least not in all directions. The grating area and the detector area in most cases would be generally the same size. The incoming light will have a spot size as well. It's desirable for efficiency for the grating and the detector to be larger than the spot size of the incident light. Thus it may be desirable for the spot to be received on one side of the grating and angled to the other side of the grating so that all the light is directed towards the side of the grating away from where the spot is received. In the alternative, especially if the light is received at 90 degrees, the beam spot would be desirably located in the middle of the grating.

Gates and interconnect 128 are depicted as a block above the silicon portion of the substrate. This is depicting a typical configuration of an integrated circuit made on silicon. The transistors are a combination of the gates that are above the silicon and sources and drains are in the silicon. The combination of sources and drains and gates and interconnects are the tools by which integrated circuits are typically made. These integrated circuits can be quite simple or they can be extremely complex such as a microcomputer or microprocessor. They can have a variety of functions as well such as memory, digital to analog converters, and amplifiers. This is shown to indicate the planned integration of a photodetector with normal integrated circuit structures. The information retrieved by detector 124 may be transmitted to processing circuitry 132 by a source and drain type of interconnect or it may be achieved by an above substrate interconnect such as metal or polysilicon.

The thicknesses of the insulator and detector and the height of the grating are chosen in relation to the frequency of the incident light. The spacing of the grating features is also chosen in relation to the frequency. In the present example, the expected frequency corresponds to a wavelength of 850 nm. The thickness of insulator 126 is chosen to be an odd multiple of a quarter optical wavelength of the light with respect to insulator 126. Thus, the index of refraction must be taken into account. In this case insulator 126 is preferably silicon oxide, which has an index of refraction of 1.45. Thus the thickness of insulator 126 is preferably about one fourth of 850 nm divided by 1.45, which is about 146 nm, or odd multiples of this number.

Similarly, the sum of the thicknesses of the waveguide and the grating, which is shown in FIG. 12 as detector 124 and grating 122, is one half of the optical wavelength or even multiples of this number. The average index of refraction of the silicon waveguide and the average index of refraction of the grating must be taken into account. In the case of the grating, the index of refraction of air must be averaged with the material that forms the grating feature. This averaging must take into account the square relationship required for averaging indexes of refraction. The waveguide is silicon with an index of refraction of 3.62. For a simple example where the volume of features is the same as the volume of air in the grating and the features are silicon, the average index of refraction equals the square root of the quantity of the square of 3.62 plus the square of 1 all divided by 2. Thus the index of refraction is the square root of 13.1 plus 1 divided by two, which equals the square root of 7.05, which equals 2.65. Thus, the thickness of the waveguide times 3.62 plus the height of the grating times 2.65 equals one half of 850 nm. A benefit of this approach is that the thickness of the waveguide and the height of the grating can be varied so long as this condition is met.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. An optical device comprising:
   a substrate comprising an insulating layer, an active semiconductor region above the insulating layer and a non-active semiconductor region below the insulating layer;
   a detector within the active semiconductor region and over a first portion of the insulating layer; and
   a grating over at least a portion of the detector.

2. The device of claim 1 wherein the insulating layer is silicon dioxide.

3. The device of claim 2 wherein the active semiconductor region is lightly-doped silicon-on-insulator.

4. The device of claim 1 wherein the non-active region is lightly-doped silicon.

5. The device of claim 1 wherein the active semiconductor region between the insulating layer and the grating portion form a waveguide.

6. The optical device of claim 1 further comprising processing circuitry over a second portion of the insulating layer.

7. The device of claim 6 wherein the processing circuitry comprises gates and interconnects and source and drain regions.

8. The device of claim 7 wherein the gates and interconnects are formed over the active region and the source and drain regions are formed within the active region.

9. The device of claim 1 wherein the detector comprises heavily-doped regions and lightly-doped regions.

10. The device of claim 8 wherein the lightly-doped regions are doped at a concentration less than or equal to approximately $10^{14}$ atoms/cm$^2$.

11. The device of claim 8 wherein a first portion of the heavily-doped regions is doped p-type and a second portion of the heavily-doped regions is doped n-type.

12. The device of claim 10 wherein a heavily-doped region of the first portion is separated from a heavily-doped region of the second portion by a lightly-doped region.

13. The device of claim 1 wherein the grating comprises a plurality of features.

14. The device of claim 13 wherein the plurality of features have an approximate shape selected from the group containing a pyramid, a hexagon, a hemisphere, and a line.

15. A method for operating an optical device comprising:
   providing a light at an angle to a substrate, wherein the substrate comprises an insulating region and an active region above the insulating region;
   directing the light to the semiconductor device in the active region;
   biasing a detector having doped regions in the active region;
   collecting carriers in the active region to define a signal, wherein the carriers are generated by the light in the active region; and
   processing the signal.

16. The method of claim 15 wherein the angle is at a right angle.

17. The method of claim 15, wherein the active region further comprises a lightly doped region and wherein biasing the detector is further defined as causing the lightly doped region to be fully depleted.

18. A method of forming an optical device comprising:
   providing a semiconductor substrate wherein the substrate comprises an insulating layer;
   forming a detector over a first portion of the insulating layer;
   forming a grating over a portion of the detector; and forming process circuitry over a second portion of the insulating layer.

19. An optical device comprising:
   a substrate comprising a silicon-on-insulator region comprising an insulating region and a silicon region over the insulating region;
   a waveguide portion within at least a portion of the silicon region;
   a detector within the waveguide portion, wherein the detector comprises a plurality of heavily-doped regions; and
   a diffraction grating comprising a plurality of features over at least a portion of the detector.

20. The optical device of claim 19, wherein the diffraction grating comprises features comprising silicon.

21. The optical device of claim 19, wherein the waveguide is disposed between the diffraction grating and the insulating region.

22. A diffraction grating coupler structure comprising:
   a first material, with a first refractive index;
   a second material over the first material, wherein the second material has a second refractive index and the second refractive index is greater than the first refractive index; and
   a third material over the second material with a third refractive index, wherein the third material comprises a plurality of features, wherein the plurality of features are approximately equidistant from each other and have an approximate shape selected from the group containing a pyramid and a hemisphere.

23. The diffraction grating coupler structure of claim 22, wherein the plurality of features comprise the hemisphere shape and are in a hexagonal pattern.

* * * * *

UNITED STATES PATENT AND TRADEMARK OFFICE
CERTIFICATE OF CORRECTION

PATENT NO. : 6,633,716 B2
DATED : October 14, 2003
INVENTOR(S) : Sebastian M. Csutak It is certified that error appears in the above-identified patent and that said Letters Patent is hereby corrected as shown below:

<u>Column 8,</u>
Lines 8-9, change "insulating layer; and
a grating over at least a portion of the detector." to
-- insulating layer;
-- a grating over at least a portion of the detector; and
a waveguide within the active semiconductor region between the insulating layer and the grating. --
Lines 16-18, delete claim 5.
Lines 65-67, change "forming a detector over a first portion of the insulating layer;
forming a grating over a portion of the detector; and" to
-- forming a detector over a first portion of the insulating layer;
forming a waveguide over the first portion of the insulating layer;
forming a grating over a portion of the detector; and --

Signed and Sealed this

Twenty-seventh Day of July, 2004

JON W. DUDAS
*Acting Director of the United States Patent and Trademark Office*